(12) United States Patent
Ryu et al.

(10) Patent No.: US 12,745,385 B2
(45) Date of Patent: Sep. 22, 2026

(54) SEMICONDUCTOR DEVICE AND METHOD FOR FORMING THE SAME

(71) Applicant: SK hynix Inc., Gyeonggi-do (KR)

(72) Inventors: Seong Wan Ryu, Gyeonggi-do (KR); Yoon Jae Nam, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 371 days.

(21) Appl. No.: 18/480,508

(22) Filed: Oct. 4, 2023

(65) Prior Publication Data

US 2024/0381622 A1 Nov. 14, 2024

(30) Foreign Application Priority Data

May 11, 2023 (KR) ........................ 10-2023-0060938

(51) Int. Cl.
*H10B 12/00* (2023.01)

(52) U.S. Cl.
CPC .......... *H10B 12/34* (2023.02); *H10B 12/053* (2023.02)

(58) Field of Classification Search
CPC .... H10D 64/514; H10D 64/513; H10B 12/34; H10B 12/053
See application file for complete search history.

(56) References Cited

U.S. PATENT DOCUMENTS

| | | | | |
|---|---|---|---|---|
| 8,901,630 | B2 | 12/2014 | Huh et al. | |
| 9,530,849 | B2 | 12/2016 | Oh et al. | |
| 2008/0054341 | A1* | 3/2008 | Natori | H10D 30/6891 257/E21.294 |
| 2010/0159674 | A1* | 6/2010 | Kim | H01L 21/2007 257/E21.09 |
| 2019/0259839 | A1* | 8/2019 | Ryu | H01L 21/324 |
| 2021/0159262 | A1* | 5/2021 | Hou | G01T 1/2018 |
| 2021/0183865 | A1 | 6/2021 | Neelapala et al. | |
| 2024/0053674 | A1* | 2/2024 | Chen | H01L 21/0332 |

FOREIGN PATENT DOCUMENTS

| | | | | |
|---|---|---|---|---|
| CN | 113053844 A | * | 6/2021 | H01L 23/488 |

* cited by examiner

*Primary Examiner* — Mamadou L Diallo
(74) *Attorney, Agent, or Firm* — IP&T GROUP LLP

(57) ABSTRACT

A semiconductor device includes a trench formed in a substrate; a gate dielectric layer suitable for covering a bottom surface and sidewalls of the trench; a first gate electrode suitable for gap-filling a bottom portion of the trench over the gate dielectric layer; a second gate electrode formed over the first gate electrode; and an anti-oxidation layer disposed at an interface between the first gate electrode and the second gate electrode.

16 Claims, 6 Drawing Sheets

SEMICONDUCTOR DEVICE AND METHOD FOR FORMING THE SAME

CROSS-REFERENCE TO RELATED APPLICATIONS

The present application claims priority of Korean Patent Application No. 10-2023-0060938, filed on May 11, 2023, which is incorporated herein by reference in its entirety.

BACKGROUND

1. Field

Embodiments of the present disclosure relate to a semiconductor device, and more particularly, to a semiconductor device including a buried gate.

2. Description of the Related Art

As the electronic industry highly advances, the demand for highly integrated semiconductor devices is gradually increasing. In particular, polysilicon has been applied as a double gate electrode to improve gate induced drain leakage (GIDL) characteristics.

SUMMARY

Embodiments of the present disclosure are directed to a semiconductor device with improved electrical characteristics.

In accordance with one embodiment of the present disclosure, a semiconductor device includes: a trench formed in a substrate; a gate dielectric layer suitable for covering a bottom surface and sidewalls of the trench; a first gate electrode suitable for gap-filling a bottom portion of the trench over the gate dielectric layer; a second gate electrode formed over the first gate electrode; and an anti-oxidation layer disposed at an interface between the first gate electrode and the second gate electrode.

In accordance with one embodiment of the present invention, a method for fabricating a semiconductor device includes: forming a trench in a substrate; covering a bottom surface and sidewalls of the trench with a gate dielectric layer; gap-filling a bottom portion of the trench over the gate dielectric layer with a first gate electrode; disposing an anti-oxidation layer locally on the first gate electrode; forming over the anti-oxidation layer and in the trench a second gate electrode; forming over the second gate electrode and in the trench a capping layer and thereby completing the buried gate structure; and forming source-drain regions in the substrate adjacent to the trench.

DETAILED DESCRIPTION

Figure 1:
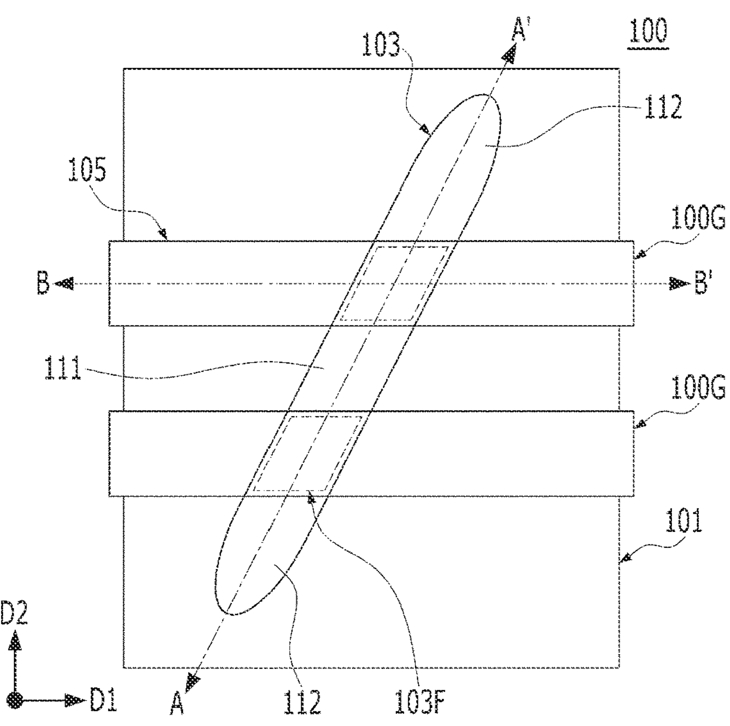
FIG. 1 is a plan view illustrating a semiconductor device in accordance with one embodiment of the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will convey the scope of the present disclosure to those skilled in the art. Throughout this disclosure, like reference numerals refer to like parts throughout the various figures and embodiments of the present disclosure.

The drawings are not necessarily to scale and in some instances, proportions may have been exaggerated in order to clearly illustrate features of the embodiments. When dimensions of the elements described herein refer to "approximately," the dimensions given may vary by +/−5%. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
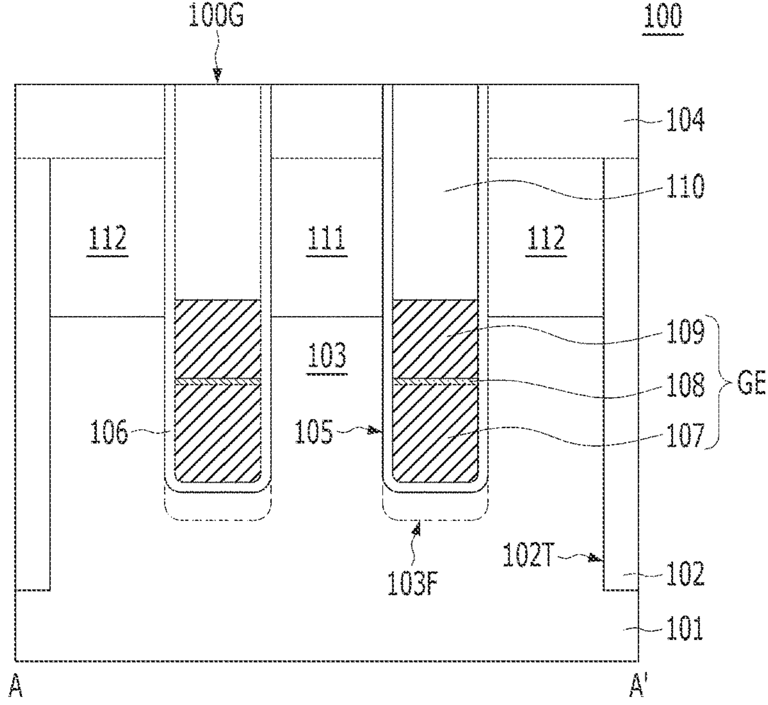
FIG. 2A is a cross-sectional view taken along a line A-A' shown in FIG. 1.
Figure 2B:
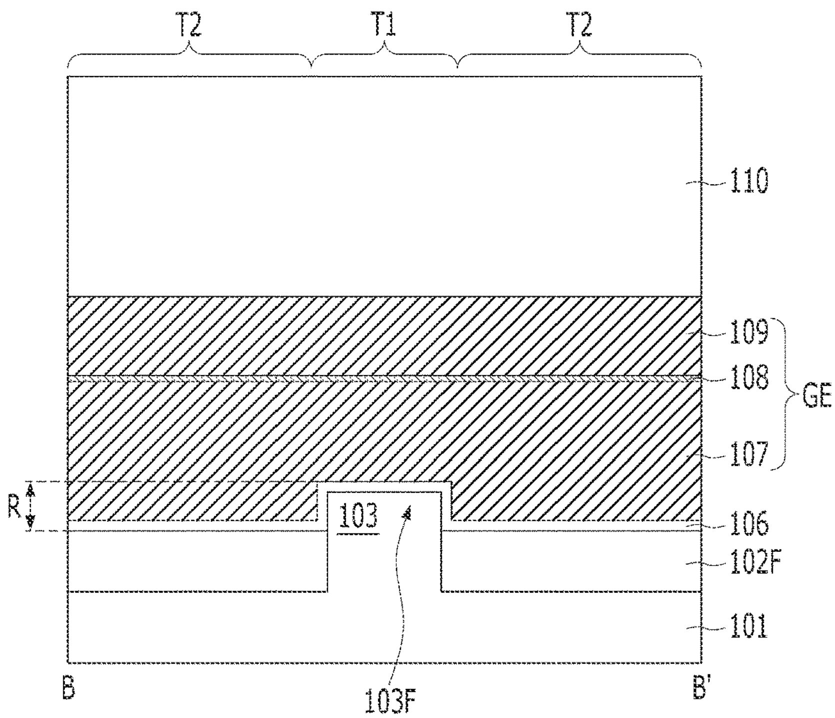
FIG. 2B is a cross-sectional view taken along a line B-B' shown in FIG. 1.

FIG. 1 is a plan view illustrating a semiconductor device 100 in accordance with one embodiment of the present disclosure. FIG. 2A is a cross-sectional view taken along a line A-A' of FIG. 1. FIG. 2B is a cross-sectional view taken along a line B-B' of FIG. 1.

When as noted above polysilicon is applied as a double gate electrode to improve the GIDL characteristics, the gate resistance increases due to a decrease in line width of a word line. Therefore, there is a need for a structure capable of addressing the increase in gate resistance while improving the GIDL characteristics. In this context, the present disclosure arises. Referring to FIGS. 1, 2A and 2B, the semiconductor device 100 may include a substrate 101 and a buried gate structure 100G (such as a double gate structure) embedded in the substrate 101. The semiconductor device 100 may be a portion of a memory cell. For example, the semiconductor device 100 may be a portion of a Dynamic Random Access Memory (DRAM) memory cell.

The substrate 101 may be a material suitable for semiconductor processing. The substrate 101 may include a semiconductor substrate. The substrate 101 may be formed of a silicon-containing material. The substrate 101 may include for example one or more of silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include other semiconductor materials, such as germanium. The substrate 101 may include a III/V-group semiconductor substrate, for example, a compound semiconductor substrate, such as GaAs. The substrate 101 may include a Silicon-On-Insulator (SOI) substrate. An isolation layer 102 and an active region 103 may be formed in the substrate 101. The active region 103 may be defined by the isolation layer 102. The isolation layer 102 may be a Shallow Trench Isolation (STI) region that is formed by a trench etching process. The isolation layer 102 may be formed by filling a shallow trench, for example, an isolation trench 102T, with a dielectric material. The isolation layer 102 may include for example silicon oxide, silicon nitride, or a combination thereof.

As shown in FIG. 2A, a trench 105 may be formed in the substrate 101. The trench 105 may be formed by etching the substrate 101 using a hard mask layer 104 (described with reference to FIG. 3A) as an etch barrier. From the perspective of a plan view of FIG. 1, the trench 105 may have a line shape extending in one direction. The trench 105 may have a line shape crossing the active region 103 and the isolation layer 102. The trench 105 may have a shallower depth than the isolation trench 102T. According to another embodiment of the present disclosure, the bottom portion of the trench 105 may have a curvature. The trench 105 may be a space in which the buried gate structure 100G is formed, and this configuration may be referred to as a 'gate trench'.

A first doped region 111 and a second doped region 112 may be formed in the active region 103. The first doped region 111 and the second doped region 112 may be regions doped with a conductive dopant. For example, the conductive dopant may include one or more of phosphorus (P), arsenic (As), antimony (Sb), or boron (B). The first doped region 111 and the second doped region 112 may be doped with dopants of the same conductivity type. The first doped region 111 and the second doped region 112 may be disposed in the active region 103 on both sides of the trench 105. The bottom surfaces of the first doped region 111 and the second doped region 112 may be disposed at a predetermined depth from the top surface of the active region 103. The bottom surfaces of the first doped region 111 and the second doped region 112 may be higher than the bottom surface of the trench 105. The first doped region 111 may be referred to as a 'first source/drain region', and the second doped region 112 may be referred to as a 'second source/drain region'. A channel may be defined between the first doped region 111 and the second doped region 112 by the buried gate structure 100G. The channel may be defined along the profile of the trench 105.

As shown in FIG. 2B, the trench 105 may include a first trench T1 and a second trench T2. The first trench T1 may be formed in the active region 103. The second trench T2 may be formed in the isolation layer 102. The trench 105 may continuously extend from the first trench T1 to the second trench T2. In the trench 105, the bottom surface of the first trench T1 may be disposed at a higher level than the bottom surface of the second trench T2. A height difference between the first trench T1 and the second trench T2 may be formed as the isolation layer 102 is recessed. Accordingly, the second trench T2 may include a recess region R having a lower bottom surface than the bottom surface of the first trench T1. A fin 103F may be formed in the active region 103 due to a step difference between the first trench T1 and the second trench T2. Thus, active region 103 may include a fin 103F.

As described above, a fin 103F may be formed below the first trench T1, and the sidewalls of the fin 103F may be exposed by the recessed isolation layer 102F. The fin 103F may be a portion in which a portion of a channel is formed. The fin 103F may be referred to as a saddle fin. The fin 103F may increase the channel width and improve electrical characteristics.

According to another embodiment of the present disclosure, the fin 103F may be omitted.

The buried gate structure 100G may include a gate dielectric layer 106 covering the bottom surface and sidewalls of the trench 105, and a gate electrode structure GE and a capping layer 110 that are sequentially stacked over the gate dielectric layer 106 to fill the trench 105. The gate electrode structure GE may include a stacked structure of a first gate electrode 107, an anti-oxidation layer 108, and a second gate electrode 109. The first gate electrode 107 may fill the lower portion of the trench 105 over the gate dielectric layer 106. The anti-oxidation layer 108 may be formed over the first gate electrode 107. The second gate electrode 109 may be formed over the anti-oxidation layer 108. The second gate electrode 109 may fill the middle portion of the trench 105. The capping layer 110 may fill the upper portion of the trench 105 over the second gate electrode 109. The lower portion, the middle portion, and the upper portion of the trench 105 may be provided for the sake of convenience in description, and the thickness (or depth) of each portion may be the same as or different from each other.

The gate dielectric layer 106 may include for example one or more of silicon oxide, silicon nitride, silicon oxynitride, a high-k material, or a combination thereof. The high-k material may include a material having a higher dielectric constant than that of silicon oxide. For example, the high-k material may include a material having a greater dielectric constant than approximately 3.9. In another example, the high-k material may include a material having a greater dielectric constant than approximately 10. In another example, the high-k material may include a material having a dielectric constant of approximately 10 to 30. The high-k material may include at least one metallic element. The high-k material may include a hafnium-containing material. The hafnium-containing material may include for example one or more of hafnium oxide, hafnium silicon oxide, hafnium silicon oxynitride, or a combination thereof. According to another embodiment of the present disclosure, the high-k material may include for example one or more of lanthanum oxide, lanthanum aluminum oxide, zirconium oxide, zirconium silicon oxide, zirconium silicon oxynitride, aluminum oxide, or a combination thereof. As the high-k material, other known high-k materials may be selectively used. The gate dielectric layer 106 may include a metal oxide.

The upper surface of the gate electrode structure GE may be disposed at a lower level than the upper surface of the active region 103. The first gate electrode 107 may have a shape filling the bottom portion of the trench 105.

The upper surface of the first gate electrode 107 may be disposed at a lower level than bottom surfaces of the first and second doped regions 111 and 112. Accordingly, the first gate electrode 107 may not overlap with the first and second doped regions 111 and 112 in a parallel direction to the surface of the substrate 101. The first gate electrode 107 may be a metal-based material. The first gate electrode 107 may include a metal nitride. For example, the first gate electrode 107 may include titanium nitride (TIN).

According to another embodiment of the present disclosure, the first gate electrode 107 may include for example one or more selected from the group including titanium nitride (TIN), molybdenum (Mo), tantalum nitride (TaN), lanthanum (La), hafnium (Hf), tantalum (Ta), aluminum (Al), aluminum oxide ($Al_2O_3$), titanium silicon nitride (TiSiN) and tantalum silicon nitride (TaSiN), or a combination thereof, but the present disclosure is not limited thereto.

The second gate electrode 109 may partially or entirely overlap with the first and second doped regions 111 and 112 in the parallel direction to the surface of the substrate 101. The second gate electrode 109 may include the same metal nitride as the first gate electrode 107. For example, the second gate electrode 109 may include titanium nitride (TIN).

According to another embodiment of the present disclosure, second gate electrode 109 may include for example one or more selected from the group including titanium nitride (TiN), molybdenum (Mo), tantalum nitride (TaN), lanthanum (La), hafnium (Hf), tantalum (Ta), aluminum (Al), aluminum oxide ($Al_2O_3$), titanium silicon nitride (TiSiN) and tantalum silicon nitride (TaSiN), or a combination thereof, but the present disclosure is not limited thereto.

The anti-oxidation layer 108 may be disposed between the first gate electrode 107 and the second gate electrode 109. The anti-oxidation layer 108 may be disposed at an interface between the first gate electrode 107 and the second gate electrode 109. The anti-oxidation layer 108 may not be disposed between a sidewall of the second gate electrode 109 and the gate dielectric layer 106. The anti-oxidation layer 108 may be of a bar shape. The anti-oxidation layer 108 may play a role in preventing oxidation of the first and second gate electrodes 107 and 109 by collecting impurities (e.g., oxygen) contained in the first gate electrode 107 and the second gate electrode 109. Accordingly, it is possible to prevent deterioration of the electrical characteristics of the buried gate structure 100G (e.g., excessive increase in a work function, etc.) due to oxidation of the first and second gate electrodes 107 and 109. Also, since the anti-oxidation layer 108 is disposed at the interface between the first gate electrode 107 and the second gate electrode 109, diffusion of materials between the first gate electrode 107 and the second gate electrode 109 may be prevented, securing the reliability of a device.

The anti-oxidation layer 108 may include a silicon-containing material. For example, the anti-oxidation layer 108 may be formed of polysilicon. The thickness of the anti-oxidation layer 108 may be smaller than the thickness of each of the first gate electrode 107 and the second gate electrode 109. The thickness of the anti-oxidation layer 108 may be adjusted to a thickness that may prevent material diffusion between the first gate electrode 107 and the second gate electrode 109, while at the same time allowing electrical conduction between the first and second gate electrodes 107 and 109. In example, the anti-oxidation layer 108 may have a thickness of approximately 5 Å to approximately 40 Å.

As a comparative example, when the thickness of the anti-oxidation layer 108 is formed too thin, less than approximately 5 Å, the oxygen collecting ability may be lowered. Therefore, the anti-oxidation effect of the first and second gate electrodes 107 and 109 may be insufficient. Also, when the thickness of the anti-oxidation layer 108 exceeds approximately 40 Å, there is a problem in that the resistance of the semiconductor device increases due to an increase in the volume of a non-metallic material in the gate electrode. Also, when the anti-oxidation layer 108 is formed in a glass shape covering a bottom surface and sidewalls of the second gate electrode 109 rather than in a bar shape, there also is a problem in that the resistance of the semiconductor device increases due to the increase in the volume of the non-metallic material in the gate electrode.

The capping layer 110 may fill the upper portion of the trench 105 over the second gate electrode 109. The capping layer 110 may include a dielectric material. For example, the capping layer 110 may include one or more of silicon nitride, silicon oxide, silicon oxynitride, or a combination thereof.

Figure 4:
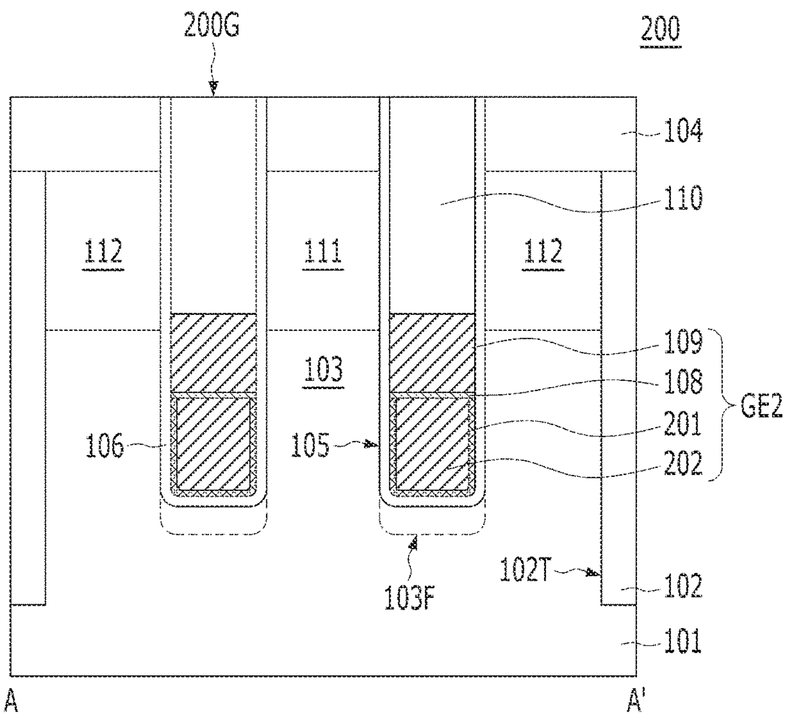
FIGS. 4 to 6 are cross-sectional view illustrating semiconductor devices in accordance with other embodiments of the present disclosure.
Figure 5:
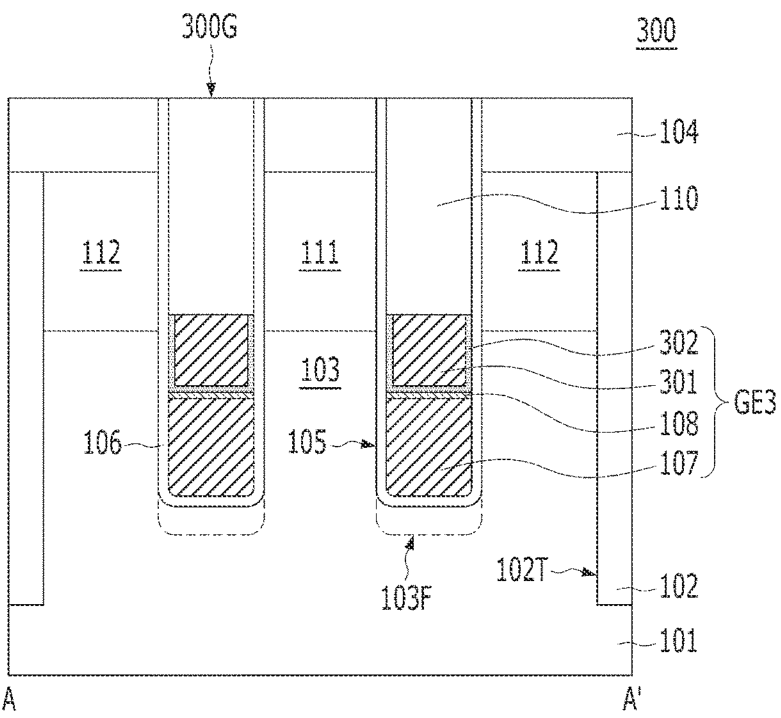
Figure 6:
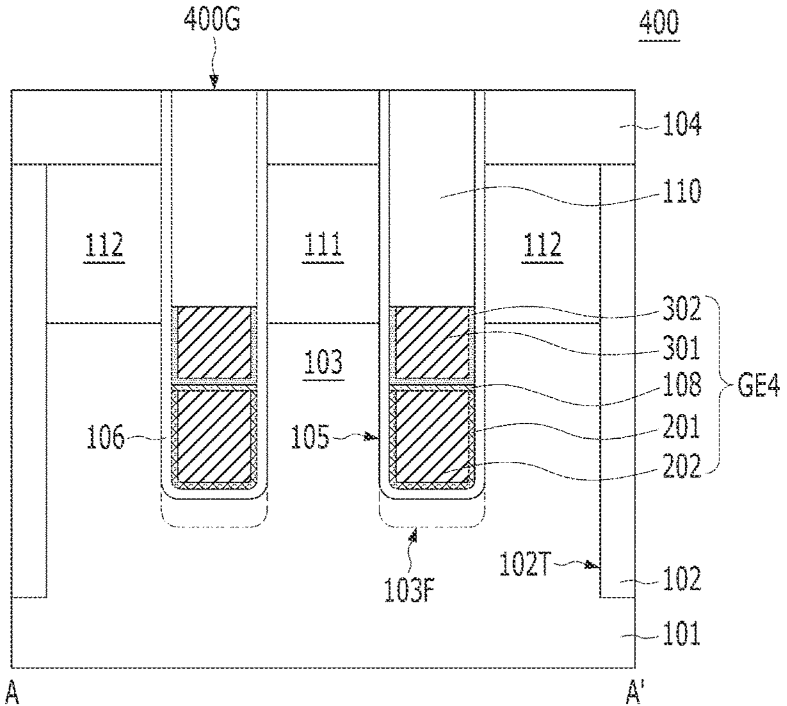

FIGS. 4 to 6 are cross-sectional view illustrating a semiconductor device in accordance with other embodiments of the present disclosure. The semiconductor device of FIG. 4 may be the same as the semiconductor device of FIG. 2A except for the first gate electrode structure. The semiconductor device of FIG. 5 may be the same as the semiconductor device of FIG. 2A except for the second gate electrode structure. The semiconductor device of FIG. 6 may be the same as the semiconductor device of FIG. 2A except for the first and second gate electrode structures. In FIGS. 4 to 6, the same parts as the semiconductor device of FIG. 2 are the same as the constituent elements of FIG. 2A, and thus they may be briefly described or omitted.

Referring to FIG. 4, the semiconductor device 200 may include a substrate 101 and a buried gate structure 200G embedded in the substrate 101. The semiconductor device 200 may be a portion of a memory cell. For example, the semiconductor device 200 may be a portion of a DRAM memory cell.

The buried gate structure 200G may include a gate dielectric layer 106 covering the bottom surface and sidewalls of the trench 105, and a gate electrode structure GE2 and a capping layer 110 that are sequentially stacked over the gate dielectric layer 106 to fill the trench 105. The gate electrode structure GE2 may include a stacked structure of a first liner gate electrode 201, a first bulk gate electrode 202, an anti-oxidation layer 108, and a second gate electrode 109. As used herein, "bulk" in reference to a gate electrode refers to the gate electrode occupying a substantial portion of the trench 205 as contrasted with a liner gate electrode which is a relatively thin film existing on a sidewall of a trench.

The first liner gate electrode 201 may be a barrier layer that may prevent the material of the first bulk gate electrode 202 from being out-diffused. The first liner gate electrode 201 may include a metal nitride, and the first bulk gate electrode 202 may include a metal material. For example, the first liner gate electrode 201 may include titanium nitride, and the first bulk gate electrode 202 may include tungsten (W) or molybdenum (Mo).

According to another embodiment of the present disclosure, the first liner gate electrode 201 may include a higher work function material than the first bulk gate electrode 202. The first bulk gate electrode 202 may include a lower resistance material than the first liner gate electrode 201. The first liner gate electrode 201 may include a metal nitride or a metal oxide, and the first bulk gate electrode 202 may include a metal-based material. For example, the first liner gate electrode 201 may include titanium silicide nitride (TiSiN) or aluminum oxide ($Al_2O_3$), and the first bulk gate electrode 202 may include titanium nitride (TIN).

Referring to FIG. 5, the semiconductor device 300 may include a substrate 101 and a buried gate structure 300G embedded in the substrate 101. The semiconductor device 300 may be a portion of a memory cell. For example, the semiconductor device 300 may be a portion of a DRAM memory cell.

The buried gate structure 300G may include a gate dielectric layer 106 covering the bottom surface and sidewalls of the trench 105, and a gate electrode structure GE3 and a capping layer 110 that are sequentially stacked over the gate dielectric layer 106 to fill the trench 105. The gate electrode structure GE3 may include a stacked structure of a first gate electrode 107, an anti-oxidation layer 108, a second liner gate electrode 301, and a second bulk gate electrode 302.

The second liner gate electrode 301 may be a barrier layer that may prevent a material of the second bulk gate electrode 302 from being out-diffused. The second liner gate electrode 301 may include a metal nitride, and the second bulk gate electrode 302 may include a metal material. For example, the second liner gate electrode 301 may include titanium nitride, and the second bulk gate electrode 302 may include tungsten (W) or molybdenum (Mo).

According to another embodiment of the present disclosure, the second liner gate electrode 301 may include a higher work function material than the second bulk gate electrode 302. The second bulk gate electrode 302 may include a lower resistance material than the second liner gate electrode 301. The second liner gate electrode 301 may include a metal nitride or a metal oxide, and the second bulk gate electrode 302 may include a metal-based material. For example, the second liner gate electrode 301 may include titanium silicide nitride (TiSiN) or aluminum oxide ($Al_2O_3$), and the second bulk gate electrode 302 may include titanium nitride (TiN).

Referring to FIG. 6, the semiconductor device 400 may include a substrate 101 and a buried gate structure 400G embedded in the substrate 101. The semiconductor device 400 may be a portion of a memory cell. For example, the semiconductor device 400 may be a portion of a DRAM memory cell.

The buried gate structure 400G may include a gate dielectric layer 106 covering the bottom surface and sidewalls of the trench 105, and a gate electrode structure GE4 and a capping layer 110 that are sequentially stacked over the gate dielectric layer 106 to fill the trench 105. The gate electrode structure GE4 may include a stacked structure of the first liner gate electrode 201, the first bulk gate electrode 202, the anti-oxidation layer 108, the second liner gate electrode 301, and the second bulk gate electrode 302.

The first liner gate electrode 201 may be a barrier layer that may prevent a material of the first bulk gate electrode 202 from being out-diffused. The first liner gate electrode 201 may include a metal nitride, and the first bulk gate electrode 202 may include a metal material. For example, the first liner gate electrode 201 may include titanium nitride, and the first bulk gate electrode 202 may include tungsten (W) or molybdenum (Mo).

According to another embodiment of the present disclosure, the first liner gate electrode 201 may include a higher work function material than the first bulk gate electrode 202. The first bulk gate electrode 202 may include a lower resistance material than the first liner gate electrode 201. The first liner gate electrode 201 may include a metal nitride or a metal oxide, and the first bulk gate electrode 202 may include a metal-based material. For example, the first liner gate electrode 201 may include titanium silicide nitride (TiSiN) or aluminum oxide ($Al_2O_3$), and the first bulk gate electrode 202 may include titanium nitride (TiN).

The second liner gate electrode 301 may be a barrier layer that may prevent the material of the second bulk gate electrode 302 from being out-diffused. The second liner gate electrode 301 may include a metal nitride, and the second bulk gate electrode 302 may include a metal material. For example, the second liner gate electrode 301 may include titanium nitride, and the second bulk gate electrode 302 may include tungsten (W) or molybdenum (Mo).

According to another embodiment of the present disclosure, the second liner gate electrode 301 may include a higher work function material than the second bulk gate electrode 302. The second bulk gate electrode 302 may include a lower resistance material than the second liner gate electrode 301. The second liner gate electrode 301 may include a metal nitride or a metal oxide, and the second bulk gate electrode 302 may include a metal-based material. For example, the second liner gate electrode 301 may include titanium silicide nitride (TiSiN) or aluminum oxide ($Al_2O_3$), and the second bulk gate electrode 302 may include titanium nitride (TiN).

FIGS. 3A to 3F are cross-sectional view illustrating a method for fabricating a semiconductor device in accordance with various embodiments of the present disclosure. FIGS. 3A to 3F illustrate one example of a method for fabricating a semiconductor device shown in FIG. 2A.

Figure 3A:
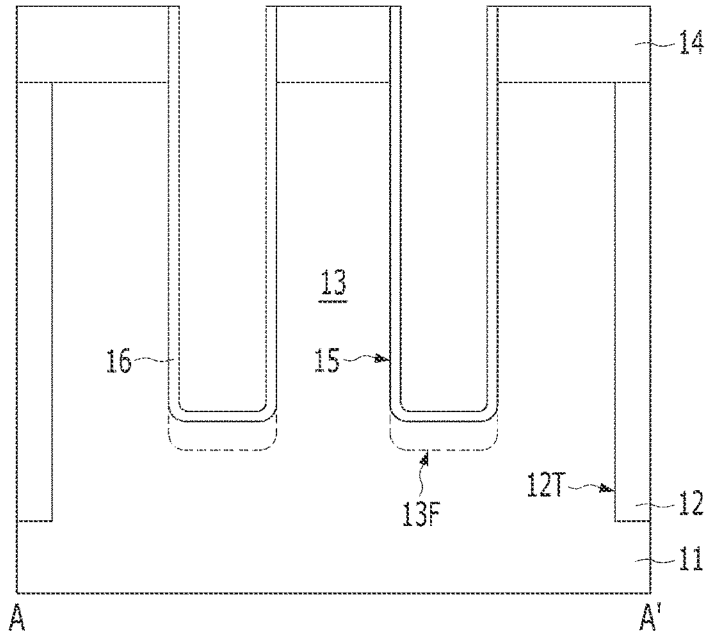
FIGS. 3A to 3F are cross-sectional view illustrating a method for fabricating a semiconductor device in accordance with another embodiment of the present disclosure.

Referring to FIG. 3A, an isolation layer 12 may be formed in the substrate 11. An active region 13 may be defined by the isolation layer 12. The isolation layer 12 may be formed by a Shallow Trench Isolation (STI) process. For example, an isolation trench 12T may be formed by etching the substrate 11. The isolation layer 12 may be formed by filling the isolation trench 12T with a dielectric material. The isolation layer 12 may include silicon oxide, silicon nitride, or a combination thereof. Chemical Vapor Deposition (CVD) or other deposition process may be used to fill the isolation trench 12T with a dielectric material. A planarization process, such as Chemical Mechanical Polishing (CMP), may additionally be used.

A trench 15 may be formed in the substrate 11. The trench 15 may be formed in a line shape crossing the active region 13 and the isolation layer 12. The trench 15 may be formed by an etching process of the substrate 11 using the hard mask layer 14 as an etching mask. The hard mask layer 14 may be formed over the substrate 11 and may have one or more line-shaped openings. The hard mask layer 14 may be formed of a material having an etch selectivity with respect to the substrate 11. The hard mask layer 14 may be a silicon oxide, such as tetra ethyl ortho silicate (TEOS). The trench 15 may be formed to be shallower than the isolation trench 12T. The depth of the trench 15 may increase the average cross-sectional area of the subsequent gate electrode. Accordingly, the resistance of the gate electrode may be reduced. The bottom edge of the trench 15 according to another embodiment of the present disclosure may have a curvature.

Subsequently, a fin 13F may be formed. In order to form the fin 13F, the isolation layer 12 below the trench 15 may be selectively recessed. As for the structure of the fin 13F, the fin 103F of FIG. 2B may be referred to.

Subsequently, a gate dielectric layer 16 may be formed on the surface of the trench 15. Before the gate dielectric layer 16 is formed, etching damage on the surface of the trench 15 may be recovered. For example, after a sacrificial oxide is formed by thermal oxidation treatment, the sacrificial oxide may be removed. The gate dielectric layer 16 may be formed by a thermal oxidation process. The gate dielectric layer 16 may include silicon oxide. According to another embodiment of the present disclosure, the gate dielectric layer 16 may be formed by Chemical Vapor Deposition (CVD) or Atomic Layer Deposition (ALD). The gate dielectric layer 16 formed by the deposition method may include a high-k material, an oxide, a nitride, an oxynitride, or a combination thereof. The high-k material may include a hafnium-containing material. The hafnium-containing material may include for example one or more of hafnium oxide, hafnium silicon oxide, hafnium silicon oxynitride, or a combination thereof. According to another embodiment of the present disclosure, the high-k material may include for example one or more of lanthanum oxide, lanthanum aluminum oxide, zirconium oxide, zirconium silicon oxide, zirconium silicon oxynitride, aluminum oxide, or a combination thereof. As for the high-k material, other known high-k materials may be selectively used. The gate dielectric layer 16 may include a stack of silicon oxide and a high-k material. Herein, the high-k material may include a material in which the amount of oxygen atoms in the same area is higher than that of silicon oxide.

Figure 3B:
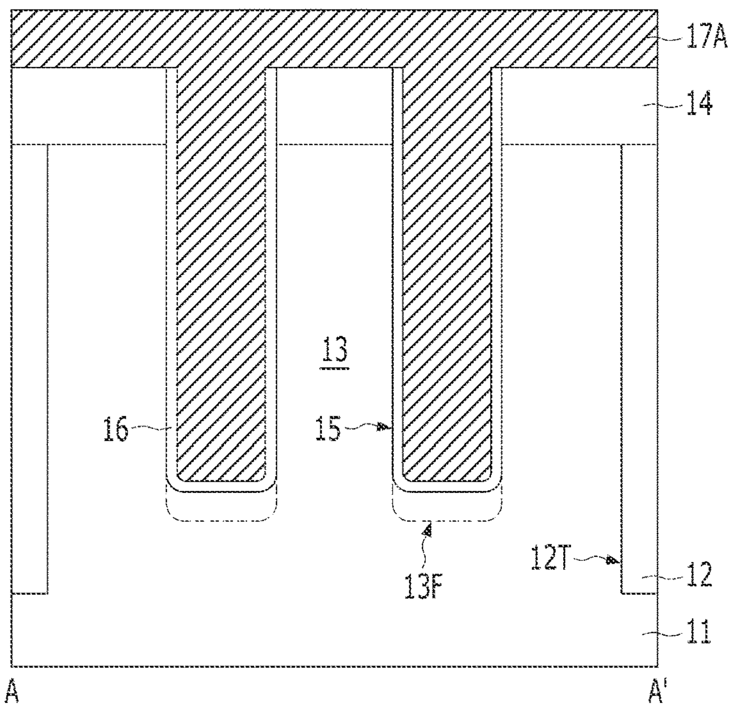

Referring to FIG. 3B, a conductive material layer 17A may be formed over the gate dielectric layer 16 and the hard mask layer 14 to gap-fill the trench 15. The conductive material layer 17A may include a metal-based material. The conductive material layer 17A may include, for example, titanium nitride. According to another embodiment of the present disclosure, conductive material layer 17A may include one or more selected from the group including titanium nitride (TiN), molybdenum (Mo), tantalum nitride (TaN), lanthanum (La), hafnium (Hf), tantalum (Ta), aluminum (Al), aluminum oxide ($Al_2O_3$), titanium silicon nitride (TiSiN) and tantalum silicon nitride (TaSiN), or a combination thereof, but the present disclosure is not limited thereto.

Figure 3C:
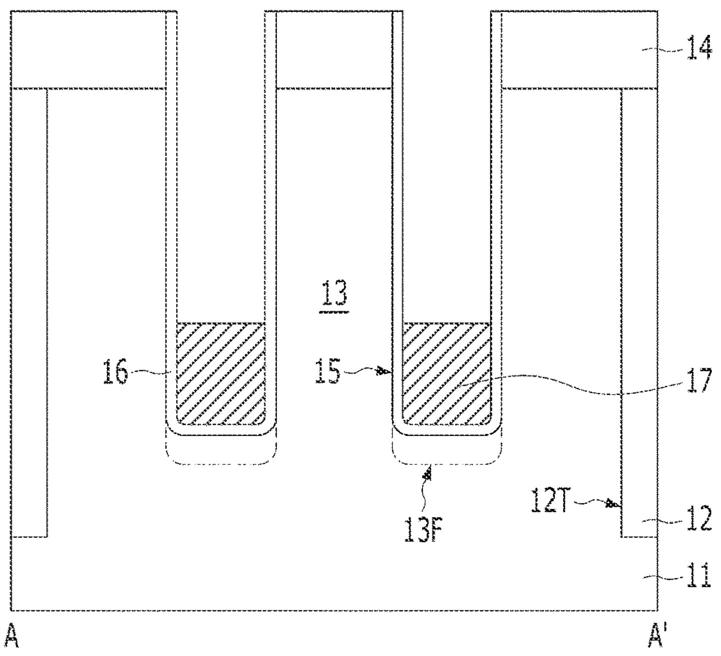

Referring to FIG. 3C, a first gate electrode 17 filling the bottom of the trench 15 may be formed. The first gate electrode 17 may be formed by performing a recessing process on the conductive material layer 17A (see FIG. 3B). The recessing process may be performed by a dry etching process, for example, an etch-back process. The etch-back process may be performed using plasma.

Figure 3D:
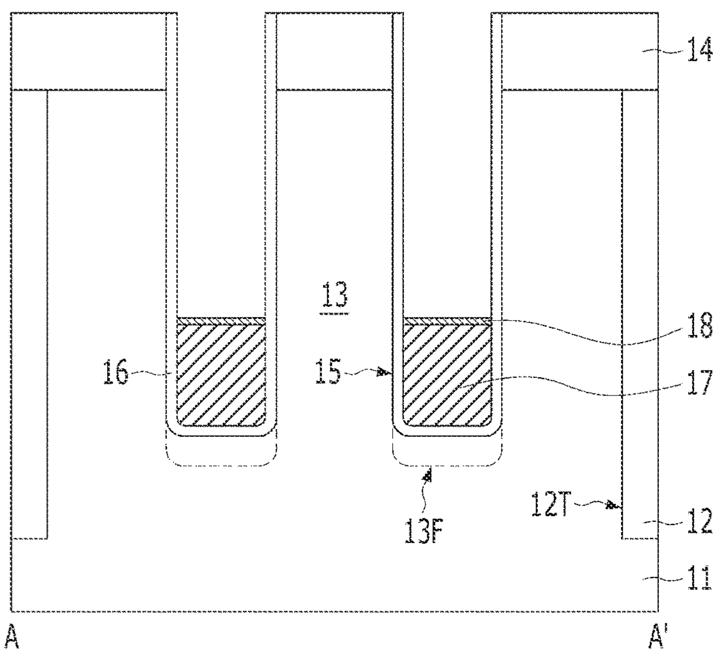

Referring to FIG. 3D, an anti-oxidation layer 18 may be formed over the first gate electrode 17. The anti-oxidation layer 18 may prevent oxidation of the first gate electrode 17 by collecting oxygen remaining on the surface of the first gate electrode 17 and impurities remaining inside the first gate electrode 17 (e.g., oxygen).

The anti-oxidation layer 18 may be formed by a series of processes of forming a liner of silicon-containing material (e.g., polysilicon) along the profile of the entire surface including the upper surface of the first gate electrode 17, and then etching the silicon-containing material over the gate dielectric layer 16 so that it may be locally disposed only on the upper surface of the first gate electrode 17. The anti-oxidation layer 18 may be formed by a deposition process.

Figure 3E:
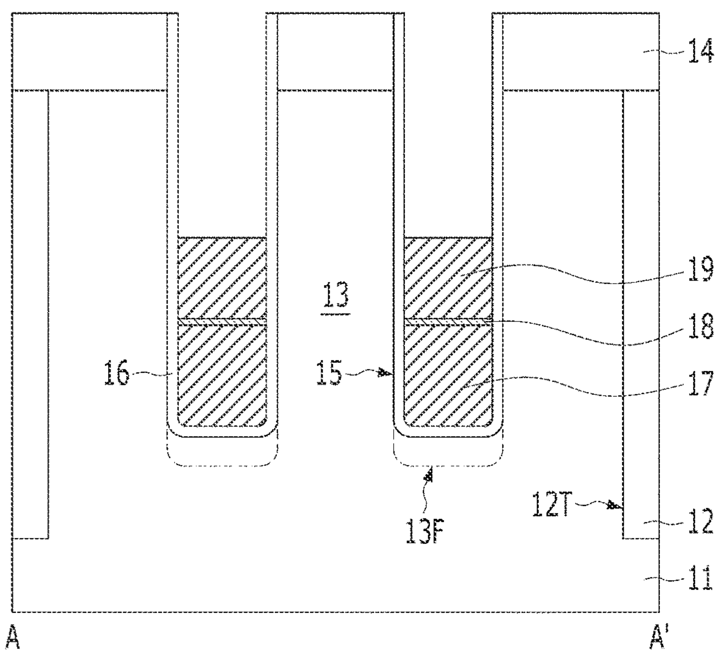

Referring to FIG. 3E, a second gate electrode 19 filling the middle portion of the trench 15 may be formed over the anti-oxidation layer 18. The second gate electrode 19 may be formed by a series of processes of forming a conductive material layer over the anti-oxidation layer 18 and the hard mask layer 14, and then through a recess process removing a part of the conductive material layer inside the trench 15. The second gate electrode 19 may include the same material as the first gate electrode 17. The second gate electrode 19 may include a metal-based material. The second gate electrode 19 may include, for example, titanium nitride. According to another embodiment of the present disclosure, the conductive material layer 17A may include one or more selected from the group including titanium nitride (TIN), molybdenum (Mo), tantalum nitride (TaN), lanthanum (La), hafnium (Hf), tantalum (Ta), aluminum (Al), aluminum oxide ($Al_2O_3$), titanium silicon nitride (TiSiN), and tantalum silicon nitride (TaSiN), or a combination thereof, but the present disclosure is not limited thereto.

According to another embodiment of the present disclosure, the anti-oxidation layer 18 and the second gate electrode 19 may be formed through an in-situ process. The anti-oxidation layer 18 may be locally formed on the upper surface of the first gate electrode 17 through a treatment process using a silicon-containing source material (e.g., $SiH_4$) before the second gate electrode 19 is formed.

Figure 3F:
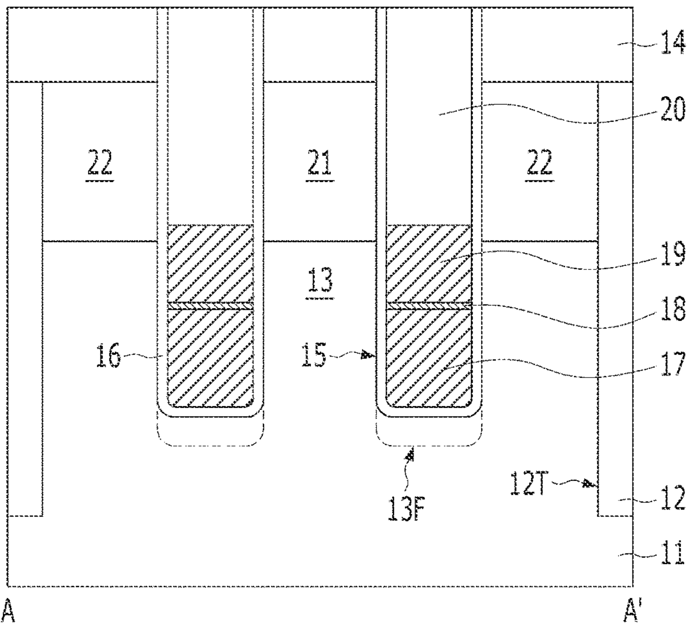

Referring to FIG. 3F, a capping layer 20 may be formed over the second gate electrode 19 to gap-fill the remaining portion of the trench 15. The capping layer 20 may include a dielectric material. For example, the capping layer 20 may include silicon nitride.

Subsequently, a process of doping impurities may be performed by an implantation technique or other doping techniques. As a result, a first doped region 21 and a second doped region 22 may be formed in the substrate 11. The first doped region 21 and the second doped region 22 may overlap with all or a portion of the second gate electrode 19 in the parallel direction to the surface of the substrate 11. The first gate electrode 17 may not overlap with the first and second doped regions 21 and 22 in the parallel direction to the surface of the substrate 11. The first and second doped regions 21 and 22 may be referred to as first and second source/drain regions, respectively.

According to one embodiment of the present disclosure, each gate electrode may be prevented from being oxidized by applying an anti-oxidation layer between the upper and lower gate electrodes that are formed of metal electrodes.

According to one embodiment of the present disclosure, it is possible to secure the reliability of a semiconductor device.

While the present disclosure has been described with respect to specific embodiments, it will be recognized to those skilled in the art that various changes and modifications may be made without departing from the scope of the disclosure described herein. Furthermore, the embodiments may be combined to form additional embodiments.

What is claimed is:

1. A semiconductor device, comprising:

a trench formed in a substrate;

a gate dielectric layer suitable for covering a bottom surface and sidewalls of the trench;

a first gate electrode suitable for gap-filling a bottom portion of the trench over the gate dielectric layer;

a second gate electrode formed over the first gate electrode; and a polysilicon layer disposed at an interface between the first gate electrode and the second gate electrode.

2. The semiconductor device of claim 1, wherein the polysilicon layer comprises a bar shape.

3. The semiconductor device of claim 1, wherein the polysilicon layer has a thickness which is smaller than a thickness of each of the first and second gate electrodes.

4. The semiconductor device of claim 1, wherein the polysilicon layer prevents material diffusion between the first gate electrode and the second gate electrode and has a thickness that allows electrical conduction between the first and second gate electrodes.

5. The semiconductor device of claim 1, wherein the polysilicon layer has a thickness of 5 Å to 40 Å.

6. The semiconductor device of claim 1, wherein the first and second gate electrodes include a metal material.

7. The semiconductor device of claim 1, wherein each of the first and second gate electrodes includes titanium nitride.

8. The semiconductor device of claim 1, wherein each of the first and second gate electrodes includes one or more selected from a group including titanium nitride (TiN), molybdenum (Mo), tantalum nitride (TaN), lanthanum (La), hafnium (Hf), tantalum (Ta), aluminum (Al), aluminum oxide $Al_2O_3$), titanium silicon nitride (TiSiN) and tantalum silicon nitride (TaSiN), or a combination thereof.

9. The semiconductor device of claim 1, wherein the first gate electrode includes a stacked structure comprising a first liner gate electrode and a first bulk gate electrode.

10. The semiconductor device of claim 9, wherein the first liner gate electrode includes a metal nitride or a metal oxide, and the first bulk gate electrode includes a metal-based material.

11. The semiconductor device of claim 1, wherein the second gate electrode includes a stacked structure comprising a second liner gate electrode and a second bulk gate electrode.

12. The semiconductor device of claim 11, wherein the second liner gate electrode includes a metal nitride or a metal oxide, and the second bulk gate electrode includes a metal-based material.

13. The semiconductor device of claim 1, further comprising:

source/drain regions formed in the substrate on both sides of the trench.

14. A method for forming a semiconductor device having a buried gate structure, comprising:

forming a trench in a substrate;

covering a bottom surface and sidewalls of the trench with a gate dielectric layer;

gap-filling a bottom portion of the trench over the gate dielectric layer with a first gate electrode;

disposing a polysilicon layer locally on the first gate electrode;

forming over the polysilicon layer and in the trench a second gate electrode;

forming over the second gate electrode and in the trench a capping layer and thereby completing the buried gate structure; and forming source-drain regions in the substrate adjacent to the trench.

15. The method of claim 14, wherein the polysilicon layer has a thickness ranging from 5 Å to 40 Å.

16. The method of claim 14, wherein the source-drain regions overlap with at least a portion of the second gate electrode in a parallel direction to a surface of the substrate.

* * * * *